United States Patent
Horie et al.

(10) Patent No.: US 8,427,227 B2
(45) Date of Patent: Apr. 23, 2013

(54) TEMPERATURE COMPENSATION CIRCUIT

(75) Inventors: Koji Horie, Kamakura (JP); Minoru Nagata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/403,121

(22) Filed: Feb. 23, 2012

(65) Prior Publication Data

US 2012/0212284 A1 Aug. 23, 2012

Related U.S. Application Data

(62) Division of application No. 12/686,613, filed on Jan. 13, 2010, now Pat. No. 8,212,605.

(30) Foreign Application Priority Data

Jan. 15, 2009 (JP) .................................... 2009-6737

(51) Int. Cl.
*G05F 3/02* (2006.01)
*H03K 17/14* (2006.01)

(52) U.S. Cl.
USPC ............ 327/513; 327/530; 330/289; 330/296

(58) Field of Classification Search .......................... None
See application file for complete search history.

(56) References Cited

U.S. PATENT DOCUMENTS

| | | | |
|---|---|---|---|
| 3,825,778 A | 7/1974 | Ahmed | |
| 5,043,992 A | 8/1991 | Royer et al. | |
| 5,883,507 A * | 3/1999 | Yin ................................ | 323/316 |
| 6,037,832 A | 3/2000 | Kaminishi | |
| 6,091,286 A | 7/2000 | Blauschild | |
| 6,946,896 B2 * | 9/2005 | Behzad ........................ | 327/512 |
| 7,119,620 B2 | 10/2006 | Pan | |
| 7,400,202 B2 | 7/2008 | Yamamoto et al. | |
| 7,492,193 B2 | 2/2009 | Kawakami | |

(Continued)

FOREIGN PATENT DOCUMENTS

| | | |
|---|---|---|
| JP | 2005-027130 | 1/2005 |
| JP | 2006191482 | 7/2006 |

OTHER PUBLICATIONS

U.S. Office Action dated Nov. 23, 2011 corresponding to U.S. Appl. No. 12/686,613, filed Jan. 13, 2010.

(Continued)

*Primary Examiner* — Lincoln Donovan
*Assistant Examiner* — Terry L Englund
(74) *Attorney, Agent, or Firm* — Turocy & Watson, LLP

(57) ABSTRACT

In one embodiment, a temperature compensation circuit includes a bias circuit configured to output a bias current having a current value increasing in proportion to an absolute temperature in a low-temperature region, and having a greater current value than the current value proportional to the absolute temperature in a high-temperature region, and a transistor which is supplied with the bias current. The bias circuit includes first to third transistors, a fourth transistor through which a first current flows, a fifth transistor, a sixth transistor through which a second current flows, and a control circuit having a connection terminal capable of being connected with an external resistor for adjusting a magnitude of the second current. The bias circuit generates a third current by adding the first current to the second current, and outputs the bias current that is the third current or a fourth current depending on the third current.

9 Claims, 8 Drawing Sheets

U.S. PATENT DOCUMENTS

| | | |
|---|---|---|
| 7,888,987 B2 | 2/2011 | Horie |
| 2005/0030105 A1 | 2/2005 | Yang et al. |
| 2005/0264363 A1 | 12/2005 | Kang et al. |
| 2009/0140792 A1 | 6/2009 | Horie |

OTHER PUBLICATIONS

Japanese Office Action mailed Jan. 17, 2012 corresponding to U.S. Appl. No. 12/686,613, filed Jan. 13, 2010.

* cited by examiner

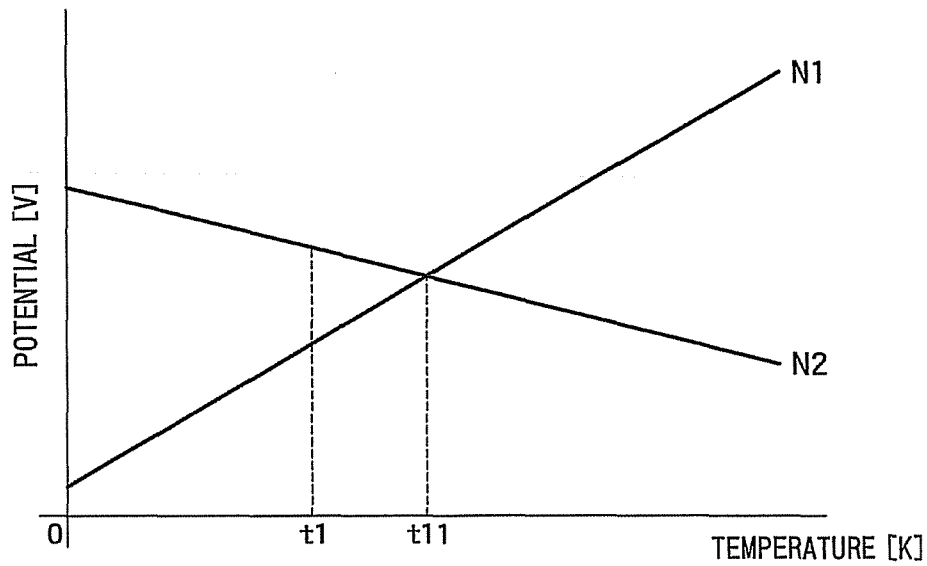
FIG. 9 (amended)

TEMPERATURE COMPENSATION CIRCUIT

CROSS REFERENCE TO RELATED APPLICATION

This application is a Division of application Ser. No. 12/686,613 filed Jan. 13, 2010, the entire contents of which are hereby incorporated by reference.

This application is based upon and claims the benefit of priority from the prior Japanese Patent Application No. 2009-6737, filed on Jan. 15, 2009, the entire contents of which are incorporated herein by reference.

BACKGROUND OF THE INVENTION

1. Field of the Invention

The present invention relates to a temperature compensation circuit, for example, for using in a wireless communication device.

2. Background Art

In a wireless communication device, particularly, in a power amplifier (high-frequency power amplifier) for a transmission system, temperature compensation is required.

In general, when a temperature characteristic with respect to a gain of a common-emitter amplifier is desired to be flattened, a current that flows in the amplifier is set to a PTAT (Proportional To Absolute Temperature) current that has a temperature characteristic proportional to an absolute temperature. Theoretically, it is considered that the temperature characteristic of the gain is thereby to be flattened. For this reason, this method is frequently used as a temperature compensation method in the common-emitter amplifier.

However, for a high frequency signal, the temperature characteristic of the amplifier causes a decrease of the gain at a high temperature actually. The decrease of the gain is considered to result from various factors such as Ft (cutoff frequency) of a transistor and an increase in resistance of metal. For this reason, conventionally, the temperature compensation for the gain at a high temperature has been insufficient.

According to a technique disclosed in JP-A 2006-191482, the decrease of the gain at a high temperature is prevented by clamping a signal line by a diode to regulate a current that flows through the diode. However, this is not suited for a high-frequency processing circuit because a large loss is brought about in the diode. For this reason, even this conventional art cannot prevent the decrease of the gain at a high temperature.

Therefore, there is a demand for providing a temperature compensation circuit that can perform the temperature compensation of the gain at a high temperature. Particularly, because the decrease of the gain is attributed to various factors, there is a strong demand for providing a temperature compensation circuit that can finely adjust the temperature compensation.

SUMMARY OF THE INVENTION

An aspect of the present invention is, for example, a temperature compensation circuit including a bias circuit configured to output a bias current having a current value increasing in proportion to an absolute temperature in a low-temperature region in which a temperature is lower than a predetermined temperature, and having a greater current value than the current value proportional to the absolute temperature in a high-temperature region in which the temperature is equal to or greater than the predetermined temperature, and a transistor having a control terminal supplied with the bias current, the bias circuit including a first current generating circuit configured to generate a first current increasing in proportion to the absolute temperature, a second current generating circuit configured to generate a second current that does not flow in the low-temperature region and flows in the high-temperature region, and a control circuit configured to control the second current and having a connection terminal capable of being connected with an external resistor for adjusting a magnitude of the second current, the bias circuit being configured to generate a third current by adding the first current to the second current, and output the bias current that is the third current or a fourth current depending on the third current.

Another aspect of the present invention is, for example, a temperature compensation circuit including a bias circuit configured to output a bias current having a current value increasing in proportion to an absolute temperature in a low-temperature region in which a temperature is lower than a predetermined temperature, and having a greater current value than the current value proportional to the absolute temperature in a high-temperature region in which the temperature is equal to or greater than the predetermined temperature, and a transistor having a control terminal supplied with the bias current, the bias circuit including a first transistor having a control terminal supplied with a first control current or voltage having a current value or a voltage value changing linearly with respect to the absolute temperature, a second transistor having a control terminal supplied with a second control current or voltage having a current value or a voltage value independent of the absolute temperature, a third transistor having a control terminal supplied with a third control current or voltage having a current value or a voltage value changing linearly with respect to the absolute temperature, a fourth transistor having a control terminal supplied with a fourth control current or voltage having a current value or a voltage value changing linearly with respect to the absolute temperature, and having a main terminal through which a first current flows, the first current increasing in proportion to the absolute temperature, a fifth transistor having a control terminal connected to the main terminal of the second transistor, a first main terminal connected to the main terminal of the third transistor, and a second main terminal, a sixth transistor having a control terminal connected to the main terminal of the first transistor, a first main terminal connected to the main terminal of the third transistor, and a second main terminal through which a second current flows, the second current not flowing in the high-temperature region and flowing in the low-temperature region, and a control circuit configured to supply the third control current or voltage to the third transistor, and having a connection terminal capable of being connected with an external resistor for adjusting a magnitude of the second current, the bias circuit being configured to generate a third current by adding the first current to the second current, and output the bias current that is the third current or a fourth current depending on the third current.

BRIEF DESCRIPTION OF THE DRAWINGS

FIG. 9 is a graph illustrating temperature characteristics of potentials at nodes N1 and N2;

DESCRIPTION OF THE EMBODIMENTS

Embodiments according to the present invention will be described with reference to the drawings.
(First Embodiment)

Figure 1:
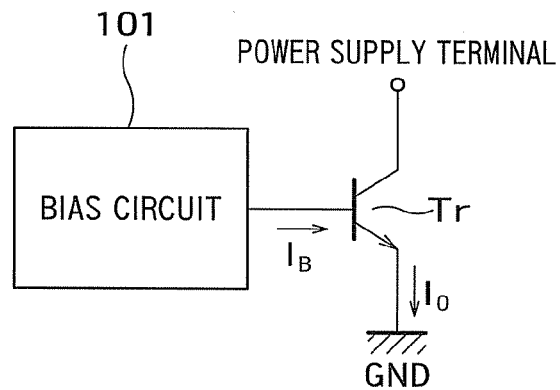
FIG. 1 is a circuit diagram illustrating a configuration of a temperature compensation circuit according to a first embodiment.

FIG. 1 is a circuit diagram illustrating a configuration of a temperature compensation circuit according to a first embodiment. The temperature compensation circuit of FIG. 1 includes a bias circuit 101, and a transistor Tr serving as a power amplifier.

The transistor Tr is a bipolar transistor, and includes a base terminal connected to the bias circuit 101, a collector terminal connected to a power supply terminal, and an emitter terminal connected to a ground line GND. In the first embodiment, the transistor Tr is an NPN bipolar transistor. Alternatively, the transistor Tr may be a PNP bipolar transistor.

The bias circuit 101 is configured to output a bias current $I_B$. The bias current $I_B$ outputted from the bias circuit 101 is supplied to the base terminal of the transistor Tr. Further, an output current $I_O$ is outputted from the emitter terminal of the transistor Tr.

The output current $I_O$ is controlled by the bias current $I_B$. The bias circuit 101 adjusts the bias current $I_B$ such that a temperature characteristic of a gain becomes flat within a performance assurance range of a circuit driven by the transistor Tr.

Figure 2:
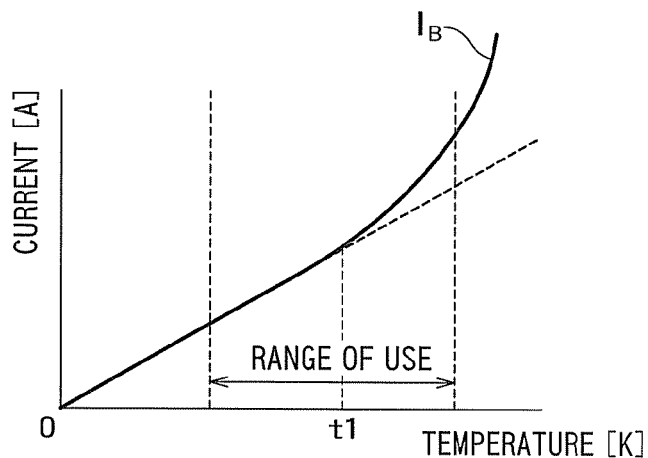
FIG. 2 is a graph illustrating a temperature characteristic of a bias current.

A method of adjusting the bias current $I_B$ will be described with reference to FIG. 2. FIG. 2 is a graph illustrating a temperature characteristic of the bias current $I_B$. In FIG. 2, a horizontal axis indicates an absolute temperature [K], and a vertical axis indicates a current [A].

As illustrated in FIG. 2, the bias current $I_B$ is adjusted so as to increase in proportion to the absolute temperature in a low-temperature region in which a temperature is lower than a predetermined temperature t1. In other words, the bias current $I_B$ in the low-temperature region is the PTAT (Proportional To Absolute Temperature) current.

On the other hand, the bias current $I_B$ is adjusted so as to have a greater current value than the current value proportional to the absolute temperature in a high-temperature region in which the temperature is equal to or greater than the predetermined temperature t1. As illustrated in FIG. 2, the bias current $I_B$ in the high-temperature region has the current value larger than the proportional relationship indicated by a dotted line, and increases gradually against the dotted line with an increase of the temperature.

Figure 3:
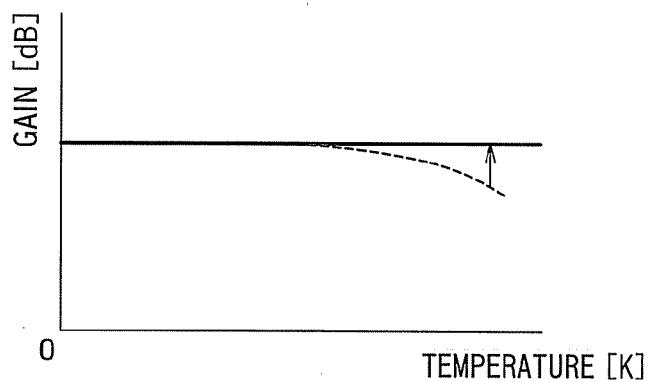
FIG. 3 is a graph illustrating a temperature characteristic of a gain of the temperature compensation circuit of FIG. 1.

A gain of FIG. 3 is realized by providing such a bias current $I_B$ to the transistor Tr. FIG. 3 is a graph illustrating the temperature characteristic of the gain of the temperature compensation circuit of FIG. 1. In FIG. 3, a horizontal axis indicates an absolute temperature [K], and a vertical axis indicates a gain [dB]. As illustrated in FIG. 3, in the first embodiment, the gain is corrected from a temperature characteristic illustrated by a dotted line where the temperature decreases with increasing temperature to a flat temperature characteristic illustrated by a solid line.

In this way, in the first embodiment, the bias current $I_B$ is adjusted so as to have a current value increasing in proportion to the absolute temperature in the low-temperature region, and to have a greater current value than the current value proportional to the absolute temperature in the high-temperature region. Consequently, in the first embodiment, the gain exhibiting the flat temperature characteristic is realized in both the low-temperature region and the high-temperature region.

The predetermined temperature t1 shown in FIG. 2 is set to +25° C., and a range of use shown in FIG. 2 is set to a range of −40° C. to +90° C., for example. The range of use means a temperature range where an LSI provided with the temperature compensation circuit of FIG. 1 can be operated normally. The above-described performance assurance range is synonymous with the range of use.

Figure 4:
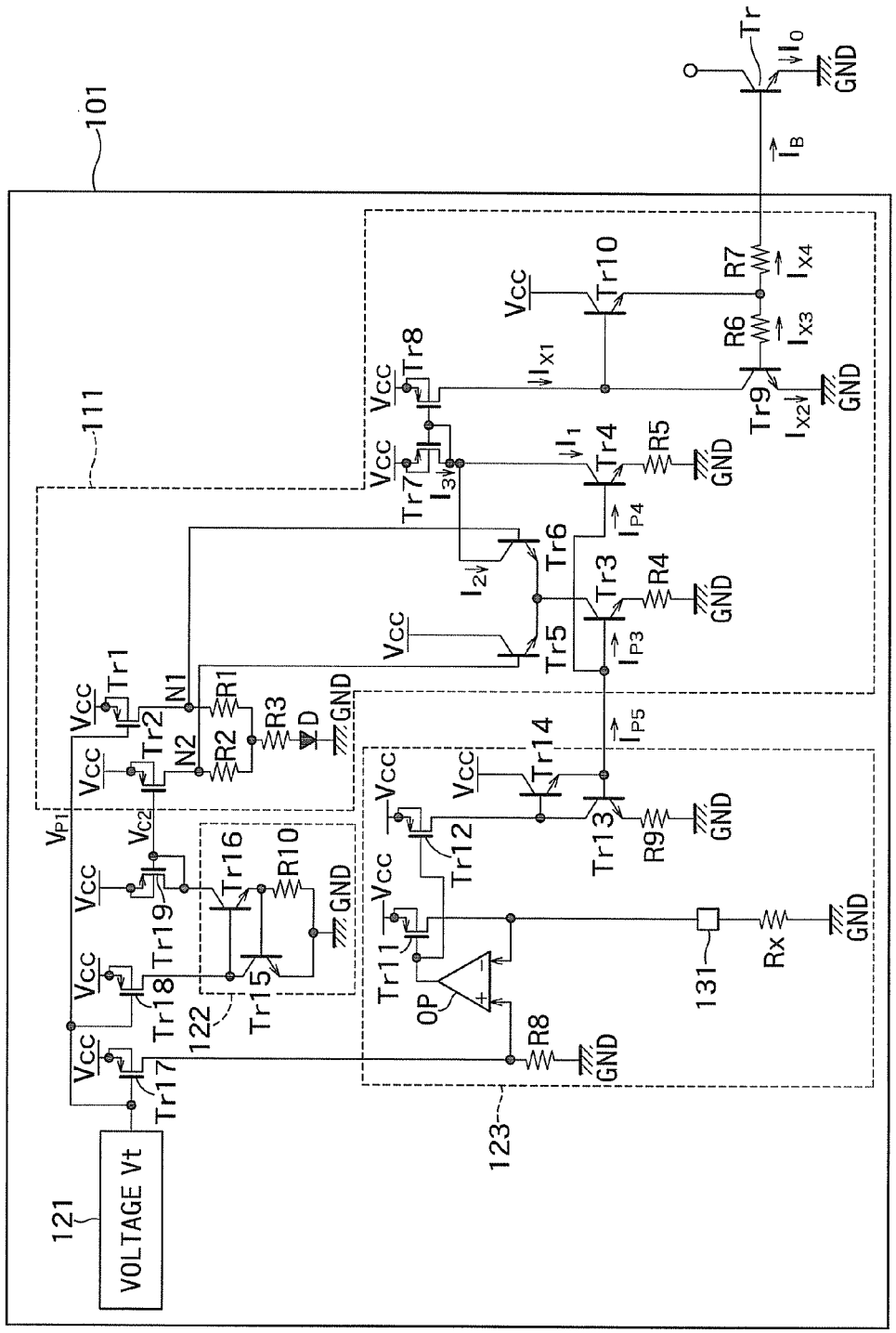
FIG. 4 is a circuit diagram illustrating a configuration of the bias circuit of FIG. 1.

FIG. 4 is a circuit diagram illustrating a configuration of the bias circuit 101 of FIG. 1. In FIG. 4, the transistor Tr is illustrated in addition to the circuit configuration of the bias circuit 101.

Figure 5:
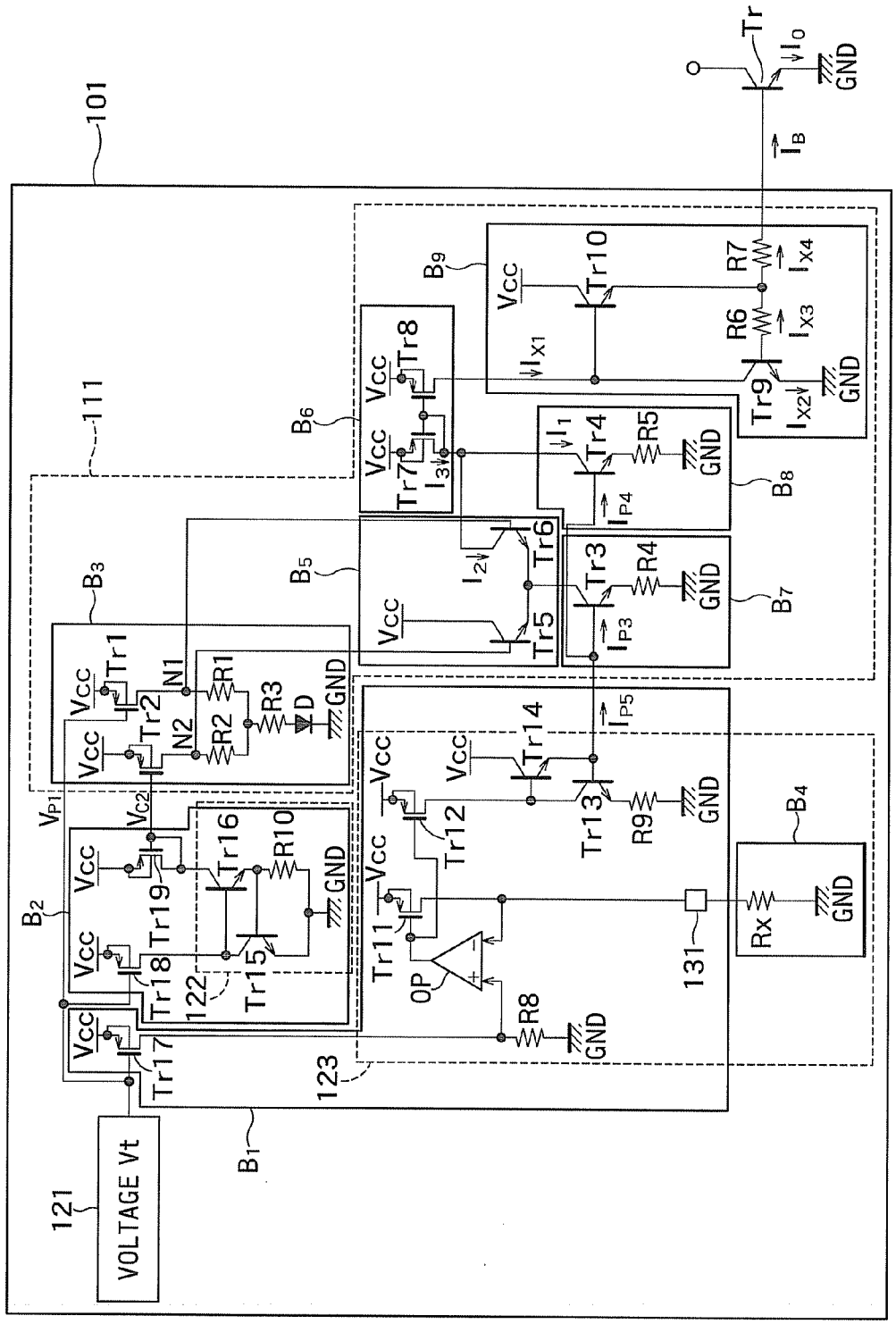
FIG. 5 is a circuit diagram where circuit blocks $B_1$ to $B_9$ are added to the circuit diagram of FIG. 4.
Figure 6:
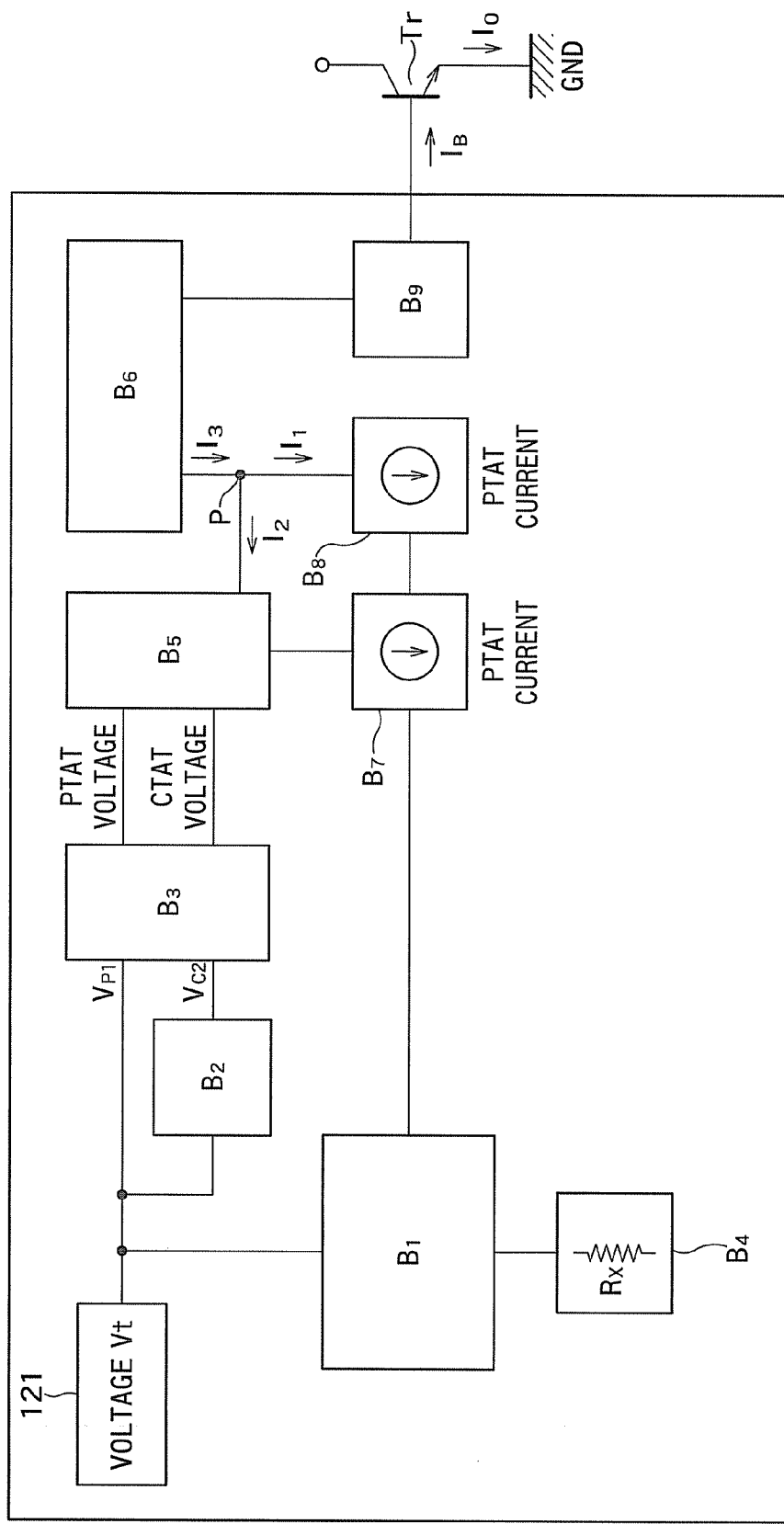
FIG. 6 is a circuit diagram where the circuit blocks $B_1$ to $B_9$ are extracted from the circuit diagram of FIG. 5.

Further, FIG. 5 is a circuit diagram where circuit blocks $B_1$ to $B_9$ are added to the circuit diagram of FIG. 4, and FIG. 6 is a circuit diagram where the circuit blocks $B_1$ to $B_9$ are extracted from the circuit diagram of FIG. 5.

Hereinafter, the bias circuit 101 will be described with reference to FIG. 6, and then details of the bias circuit 101 will be described with reference to FIG. 4. FIG. 5 will be referred to when the correspondence between FIG. 4 and FIG. 6 is described, after the description of the bias circuit 101 with reference to FIG. 6.

First, the bias circuit 101 will be described with reference to FIG. 6.

FIG. 6 illustrates a first control circuit 121 and the circuit blocks $B_1$ to $B_9$.

The first control circuit 121 uses a current source which generates a PTAT current. The first control circuit 121 generates a voltage Vt increasing linearly with respect to the absolute temperature. The voltage Vt is outputted to the circuit blocks $B_1$ to $B_3$.

The circuit block $B_1$ is configured to control a magnitude of the PTAT current using an external resistor. Due to a large variation in resistance value of an internal resistor in an integrated circuit, the external resistor is employed to control the magnitude of the PTAT current in this embodiment.

In FIG. 6, the external resistor is indicated by $R_X$. In FIG. 6, the external resistor $R_X$ is provided in the circuit block $B_4$ connected to the circuit block $B_1$. For example, the external resistor $R_X$ is a commercially available resistive element. In general, a variation of a resistance value of the commercially available resistive element is much smaller than that of the resistor in the integrated circuit.

The circuit block $B_2$ uses a current source that generates a CTAT (Complementary To Absolute Current) current. The circuit block $B_2$ combines the PTAT current and a Vbe voltage, and outputs the combined PTAT current and Vbe voltage to the circuit block $B_3$.

The circuit block $B_3$ is configured to convert the PTAT current and the CTAT current into voltages, respectively, and output a PTAT voltage and a CTAT voltage to the circuit block $B_5$.

The circuit block $B_5$ is configured to compare the PTAT voltage and the CTAT voltage outputted from the block $B_3$. In the circuit block $B_5$, when the PTAT voltage is higher than the CTAT voltage, a current drawn in the circuit block $B_5$ increases with the temperature.

The circuit blocks $B_7$ and $B_8$ are provided such that PTAT currents flow through the circuit blocks $B_7$ and $B_8$. The circuit block $B_7$ is connected to the circuit blocks $B_1$, $B_5$, and $B_8$, and the circuit block $B_8$ is connected to the circuit block $B_5$ via a node P shown in FIG. 6.

The circuit block $B_6$ is connected to the circuit blocks $B_5$ and $B_8$ via the node P. The circuit block $B_6$ automatically passes a current such that the circuit blocks $B_5$ and $B_8$ draw in the circuit. Also, the circuit block $B_6$ is a current mirror circuit of the combined current.

The circuit block $B_9$ is a current mirror circuit that supplies the bias current $I_B$ to the transistor Tr serving as the power amplifier.

FIG. 5 illustrates the correspondence between FIG. 4 and FIG. 6.

The circuit block $B_1$ includes transistors Tr11 to Tr14 and Tr17, resistors R8 and R9, an operational amplifier OP, and a connection terminal 131. The circuit block $B_2$ includes transistors Tr15, Tr16, Tr18, and Tr19, and a resistor R10. The circuit block $B_3$ includes transistors Tr1 and Tr2, resistors R1 to R3, and a diode D.

The circuit block $B_5$ includes transistors Tr5 and Tr6. The circuit block $B_6$ includes transistors Tr7 and Tr8. The circuit block $B_7$ includes a transistor Tr3 and a resistor R4. The circuit block $B_8$ includes a transistor Tr4 and a resistor R5. The circuit block $B_9$ includes transistors Tr9 and Tr10, and resistors R6 and R7.

Next, details of the bias circuit 101 will be described with reference to FIG. 4.

The bias circuit 101 includes a bias current generating circuit 111 including the first to tenth transistors Tr1 to Tr10, the first to seventh resistors R1 to R7, and the diode D. The bias current generating circuit 111 is configured to generate the bias current $I_B$.

The first transistor Tr1 is a P-type MOSFET, and includes a gate terminal supplied with a control voltage $V_{P1}$. The control voltage $V_{P1}$ is an example of a first control voltage (or current) of the present invention, and increases linearly with respect to the absolute temperature. Therefore, the control voltage $V_{P1}$ becomes a PTAT voltage, if the control voltage $V_{P1}$ at the absolute zero temperature is set to zero.

The second transistor Tr2 is a P-type MOSFET, and includes a gate terminal supplied with a control voltage $V_{C2}$. The control voltage $V_{C2}$ is an example of a second control voltage (or current) of the present invention, and is independent of the absolute temperature. Therefore, the control voltage $V_{C2}$ is a CTAT voltage that does not change depending on the absolute temperature.

Source terminals of the transistors Tr1 and Tr2 are connected to a power line Vcc. A drain terminal of the transistor Tr1 is connected to an anode of the diode D via the resistors R1 and R3, and a drain terminal of the transistor Tr2 is connected to the anode of the diode D via the resistors R2 and R3. A cathode of the diode D is connected to a ground line GND.

The third transistor Tr3 is an NPN bipolar transistor, and includes a base terminal supplied with a control current $I_{P3}$. The control current $I_{P3}$ is an example of a third control current (or voltage) of the present invention, and increases linearly with respect to the absolute temperature, specifically, increases linearly in proportion to the absolute temperature. Therefore, the control current $I_{P3}$ is a PTAT current.

The fourth transistor Tr4 is an NPN bipolar transistor, and includes a base terminal supplied with a control current $I_{P4}$. The control current $I_{P4}$ is an example of a fourth control current (or voltage) of the present invention, and increases linearly with respect to the absolute temperature, specifically, increases linearly in proportion to the absolute temperature. Therefore, the control current $I_{P4}$ is a PTAT current.

Base terminals of the transistors Tr3 and Tr4 are connected to each other. An emitter terminal of the transistor Tr3 is connected to the ground line GND via the resistor R4, and an emitter terminal of the transistor Tr4 is connected to the ground line GND via the resistor R5.

The fifth and sixth transistors Tr5 and Tr6 are NPN bipolar transistors, and form a differential amplifier. A base terminal of the transistor Tr5 is connected to the drain terminal of the transistor Tr2, and supplied with a current outputted from the transistor Tr2. A base terminal of the transistor Tr5 is connected to a node N2 between the drain terminal of the transistor Tr2 and the resistor R2. On the other hand, a base terminal of the transistor Tr6 is connected to the drain terminal of the transistor Tr1, and supplied with a current output from the transistor Tr1. A base terminal of the transistor Tr6 is connected to a node N1 between the drain terminal of the transistor Tr1 and the resistor R1.

Emitter terminals of the transistors Tr5 and Tr6 are connected to a collector terminal of the transistor Tr3, and connected to each other. A collector terminal of the transistor Tr5 is connected to the power line Vcc, and a collector terminal of the transistor Tr6 is connected to a collector terminal of the transistor Tr4.

The seventh and eighth transistors Tr7 and Tr8 are P-type MOSFETs, and form a current mirror circuit. Gate terminals of the transistors Tr7 and Tr8 are connected to each other. Source terminals of the transistors Tr7 and Tr8 are connected to the power line Vcc. A drain terminal of the transistor Tr7 is connected to the collector terminals of the transistors Tr4 and Tr6, and is connected to the gate terminals of the transistors Tr7 and Tr8.

The ninth and tenth transistors Tr9 and Tr10 are NPN bipolar transistors. An emitter terminal of the transistor Tr9 is connected to the ground line GND, and a collector terminal of the transistor Tr10 is connected to the power line Vcc. A collector terminal of the transistor Tr9 and a base terminal of the transistor Tr10 are connected to the drain terminal of the transistor Tr8, and connected to each other. A base terminal of the transistor Tr9 and an emitter terminal of the transistor Tr10 are connected to the base terminal of the transistor Tr, and connected to each other. The transistor Tr10 is provided to compensate a base current of the transistor Tr9.

The base terminal of the transistor Tr9 is connected to the emitter terminal of the transistor Tr10 via the resistor R6. The base terminal of the transistor Tr is connected to the emitter terminal of the transistor Tr10 via the resistor R7. The transistor Tr9 and the transistor Tr form a current mirror circuit.

FIG. 4 illustrates first to third currents $I_1$ to $I_3$ and currents $I_{X1}$ to $I_{X4}$ which flow in the bias current generating circuit 111.

The first current $I_1$ flows through the collector terminal of the transistor Tr4. As described above, the base terminal of the transistor Tr4 is supplied with the control current $I_{P4}$ increasing in proportion to the absolute temperature.

Figure 7:
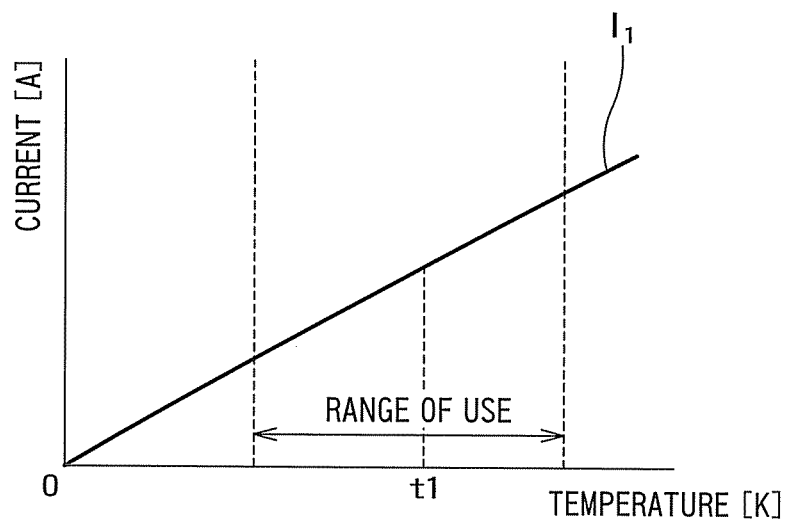
FIG. 7 is a graph illustrating a temperature characteristic of a first current.

Therefore, as illustrated in FIG. 7, the first current $I_1$ increases in proportion to the absolute temperature. FIG. 7 is a graph illustrating a temperature characteristic of the first current $I_1$. A circuit portion including the transistor Tr4 is an example of a first current generating circuit of the present invention.

On the other hand, the second current $I_2$ flows through the collector terminal of the transistor Tr6. As described above, the gate terminals of the transistors Tr1 and Tr2 are supplied with the control voltage $V_{P1}$ increasing linearly with respect to the absolute temperature, and the control voltage $V_{C2}$ independent of the absolute temperature, respectively. Also, the base terminal of the transistor Tr3 is supplied with the control current $I_{P3}$ increasing in proportion to the absolute temperature. Also, the gate terminals of the transistors Tr5 and Tr6 are connected to the drain terminals of the transistors Tr2 and Tr1, respectively.

Figure 8:
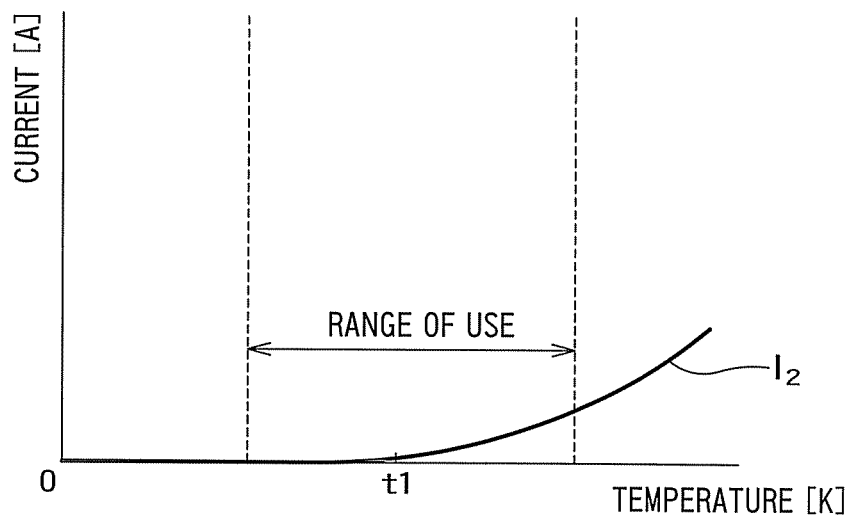
FIG. 8 is a graph illustrating a temperature characteristic of a second current.

Therefore, as illustrated in FIG. 8, the second current $I_2$ does not flow in the low-temperature region up to the predetermined temperature t1, and the second current $I_2$ flows in the high-temperature region equal to or higher than the predetermined temperature t1. FIG. 8 is a graph illustrating a temperature characteristic of the second current $I_2$. A detailed process for realizing the temperature characteristic of FIG. 8 is described later. As illustrated in FIG. 8, the second current $I_2$ in the high-temperature region increases with increasing temperature. The circuit portion including the transistors Tr1, Tr3, Tr5, and Tr6 is an example of a second current generating circuit of the present invention.

Further, the third current $I_3$ flows through the drain terminal of the transistor Tr7. As described above, the drain terminal of the transistor Tr7 is connected to the collector terminals of the transistors Tr4 and Tr6. Therefore, the third current $I_3$ corresponds to a current in which the first current $I_1$ and the second current $I_2$ are added (i.e., $I_3 = I_1 + I_2$), and the third current $I_3$ has the temperature characteristic shown in FIG. 2.

Further, the currents $I_{X1}$ to $I_{X4}$ depend on the third current $I_3$.

The current $I_{X1}$ flows through the drain terminal of the transistor Tr8. As described above, the transistors Tr7 and Tr8 form the current mirror circuit. Therefore, the current $I_{X1}$ depends on the third current $I_3$, specifically, has a current value that is $n_1$ times as large as the current value of the third current $I_3$ ($n_1$ is a positive real number). Consequently, as with the third current $I_3$, the current $I_{X1}$ has the temperature characteristic shown in FIG. 2.

The current $I_{X2}$ flows through the emitter terminal of the transistor Tr9. When the base current to the transistors Tr9 and Tr10 is not considered, the current $I_{X2}$ has the same current value as the current $I_{X1}$. Therefore, as with the third current $I_3$, the current $I_{X2}$ has the temperature characteristic shown in FIG. 2.

The current $I_{X3}$ flows through the base terminal of the transistor Tr9. Assuming that β is a current amplification factor of the transistor Tr9 (and Tr), the current $I_{X3}$ has a current value that is 1/β times as large as the current value of the current $I_{X2}$. Therefore, as with the third current $I_3$, the current $I_{X3}$ has the temperature characteristic shown in FIG. 2.

The currents $I_{X3}$ and $I_{X4}$ flow through the resistors R6 and R7, respectively. As described above, the transistors Tr9 and Tr form the current mirror circuit. Therefore, the current $I_{X4}$ depends on the current $I_3$, specifically, has a current value that is $n_2$ times as large as the current value of the current $I_{X3}$ ($n_2$ is a positive real number). Consequently, as with the third current $I_3$, the current $I_{X4}$ has the temperature characteristic shown in FIG. 2.

The bias current generating circuit 111 outputs the bias current $I_B$ that is the current $I_{X4}$ (i.e., $I_B = I_{X4}$). Consequently, the bias current $I_B$ has the temperature characteristic shown in FIG. 2. In this way, the bias current $I_B$ having the temperature characteristic shown in FIG. 2 can be generated in the first embodiment. The current $I_{X4}$ is an example of a fourth current of the present invention. The bias current $I_B$ outputted from the bias current generating circuit 111 may be the third current $I_3$, or may be a current except for the current $I_{X4}$ depending on the third current $I_3$.

The detailed process for realizing the temperature characteristic of FIG. 8 will be described with reference to FIG. 9. FIG. 9 is a graph illustrating temperature characteristics of potentials at the nodes N1 and N2 (FIG. 4). In FIG. 9, a horizontal axis indicates an absolute temperature [K], and a vertical axis indicates a potential [V].

The current that flows through the node N1 is a PTAT current. Therefore, as illustrated by a straight line N1 in FIG. 9, the potential at the node N1 has a monotonously increased temperature characteristic that increases linearly with respect to the temperature.

On the other hand, the current that flows through the node N2 is a CTAT current. Therefore, as illustrated by a straight line N2 in FIG. 9, the potential at the node N2 has an almost flat temperature characteristic that is maintained at an almost constant value irrespective of the temperature. More specifically, as illustrated by the straight line N2 in FIG. 9, the potential at the node N2 has monotonously decreased temperature characteristic that gently decreases linearly with respect to the temperature, due to the effect of the diode D of FIG. 4.

A temperature t11 indicates an absolute temperature at which the potential at the node N1 is equal to the potential at the node N2. The temperature t11 is higher than the predetermined temperature t1 (that is, t1<t11).

In a temperature region lower than the temperature t1, the potential at the node N2 is sufficiently higher than the potential at the node N1. Therefore, a current flows through the collector terminal of the transistor Tr5, but a current does not flow through the collector terminal of the transistor Tr6. Accordingly, the current value of the second current $I_2$ is zero.

When the temperature reaches t1, a small amount of current starts to flow through the collector terminal of the transistor Tr6. Accordingly, the current value of the second current $I_2$ increases gradually from zero.

When the temperature further reaches t11, the potential at the node N1 becomes equal to the potential at the node N2. At this point, the current that flows through the collector terminal of the transistor Tr6 becomes the same current value as the current that flows through the collector terminal of the transistor Tr5.

In a temperature region higher than the temperature t11, the potential at the node N2 becomes lower than the potential at the node N1. At this point, the current that flows through the collector terminal of the transistor Tr6 becomes larger than the current value of the current that flows through the collector terminal of the transistor Tr5.

Through the above-described process, the second current $I_2$ does not flow in the low-temperature region up to the predetermined temperature t1, and flows in the high-temperature region equal to or higher than the predetermined temperature t1.

Referring to FIG. 4, the description of the bias circuit 101 will be continued.

As illustrated in FIG. 4, the bias circuit 101 includes first to third control circuits 121 to 123.

The first control circuit 121 is configured to supply the control voltage $V_{P1}$ to the transistor Tr1. The first control circuit 121 outputs a voltage Vt increasing linearly with respect to the absolute temperature, and supplies the voltage Vt as the control voltage $V_{P1}$ to the transistor Tr1.

The second control circuit 122 is configured to supply the control voltage $V_{C2}$ to the transistor Tr2.

The third control circuit 123 is configured to supply the control currents $I_{P3}$ and $I_{P4}$ to the transistors Tr3 and Tr4, respectively. The third control circuit 123 outputs the control current $I_{P5}$ having a current value increasing in proportion to the absolute temperature. As illustrated in FIG. 4, the third control circuit 123 supplies a part of the control current $I_{P5}$ as the control current $I_{P3}$ to the transistor Tr3, and supplies the other part of the control current $I_{P5}$ as the control current $I_{P4}$ to the transistor Tr4 (i.e., $I_{P5}=I_{P3}+I_{P4}$). In this way, the control currents $I_{P3}$ and $I_{P4}$ depending on the control current $I_{P5}$ are supplied to the transistors Tr3 and Tr4, respectively. The control current $I_{P5}$ is an example of a fifth control current (or voltage) of the present invention. The third control circuit 123 is an example of a control circuit of the present invention.

The third control circuit 123 includes a connection terminal 131 capable of being connected with the external resistor. In FIG. 4, the external resistor connected to the connection terminal 131 is indicated by $R_X$. The external resistor $R_X$ is disposed outside an LSI provided with the temperature compensation circuit of FIG. 1. As is understood from the circuit configuration of FIG. 4, a resistance value of the external resistor $R_X$ has an influence on the current values of the control currents $I_{P3}$ and $I_{P4}$ through the current value of the control current $I_{P5}$. Further, the current values of the control currents $I_{P3}$ and $I_{P4}$ have influences on the current values of the first and second currents $I_1$ and $I_2$. Therefore, in the first embodiment, the current values of the first and second currents $I_1$ and $I_2$ can be adjusted by adjusting the resistance value of the external resistor Rx. In this way, the third control circuit 123 is capable of controlling the first and second currents $I_1$ and $I_2$. Details of the adjustments of these currents are described later.

The third control circuit 123 further includes the eleventh to fourteenth transistors Tr11 to Tr14, the eighth and ninth resistor R8 and R9, and the operational amplifier OP.

The operational amplifier OP includes a non-inverting input terminal connected to the ground line GND via the resistor R8, and an inverting input terminal connected to the connection terminal 131. The non-inverting input terminal is an example of a first input terminal of the present invention, and the inverting input terminal is an example of a second input terminal of the present invention. The non-inverting input terminal of the operational amplifier OP is supplied with a voltage that changes linearly with respect to the absolute temperature from the outside of the third control circuit 123.

The eleventh and twelfth transistors Tr11 and Tr12 are P-type MOSFETs. Gate terminals of the transistors Tr11 and Tr12 are connected to an output terminal of the operational amplifier OP. Source terminals of the transistors Tr11 and Tr12 are connected to the power line Vcc. A drain terminal of the transistor Tr11 is connected to the connection terminal 131 and the inverting input terminal of the operational amplifier OP.

The thirteenth and fourteenth transistors Tr13 and Tr14 are NPN bipolar transistors. An emitter terminal of the transistor Tr13 is connected to the ground line GND via the resistor R9, and a collector terminal of the transistor Tr14 is connected to the power line Vcc. A collector terminal of the transistor Tr13 and a base terminal of the transistor Tr14 are connected to the drain terminal of the transistor Tr12, and connected to each other. A base terminal of the transistor Tr13 and an emitter terminal of the transistor Tr14 are connected to the base terminals of the transistors Tr3 and Tr4, and connected to each other. The transistor Tr14 is provided to compensate a base current of the transistor Tr13.

The second control circuit 122 includes the fifteenth and sixteenth transistors Tr15 and Tr16, and the tenth resistor R10.

The fifteenth and sixteenth transistors Tr15 and Tr16 are NPN bipolar transistors. A collector terminal of the transistor Tr15 and a base terminal of the transistor Tr16 are connected to each other, and these terminals are supplied with currents that depend on the voltage Vt from the outside of the second control circuit 122. A base terminal of the transistor Tr15 and an emitter terminal of the transistor Tr16 are connected to the ground line GND via the resistor R10, and connected to each other. An emitter terminal of the transistor Tr15 is connected to the ground line GND, and a collector terminal of the transistor Tr16 is connected to the gate terminal of the transistor Tr2. The transistor Tr16 is provided to compensate a base current of the transistor Tr15.

Further, the bias circuit 101 includes the seventeenth to nineteenth transistors Tr17 to Tr19.

The seventeenth and eighteenth transistors Tr17 and Tr18 are P-type MOSFETs. Gate terminals of the transistors Tr17 and Tr18 are supplied with the voltage Vt from the first control circuit 121. Source terminal of the transistors Tr17 and Tr18 are connected to the power line Vcc. A drain terminal of the transistor Tr17 is connected to the ground line GND via the resistor R8, and connected to the non-inverting input terminal of the operational amplifier OP. A drain terminal of the transistor Tr18 is connected to the collector terminal of the transistor Tr15 and the base terminal of the transistor Tr16.

In this way, the transistor Tr17 supplies the current and voltage that depend on the voltage Vt to the third control circuit 123. Similarly, the transistor Tr18 supplies the current and voltage that depend on the voltage Vt to the second control circuit 122.

The nineteenth transistor Tr19 is a P-type MOSFET. A source terminal of the transistor Tr19 is connected to the power line Vcc. A drain terminal of the transistor Tr19 is connected to the collector terminal of the transistor Tr18. A gate terminal of the transistor Tr19 is connected to the collector terminal of the transistor Tr18, and connected to the gate terminal of the transistor Tr2.

As described above, according to this embodiment, the bias current $I_B$ having the temperature characteristic shown in FIG. 2 can be generated. The bias current $I_B$ has the current value that increases in proportion to the absolute temperature in the low-temperature region, and has the greater current value than the current value proportional to the absolute temperature in the high-temperature region.

Figure 10:
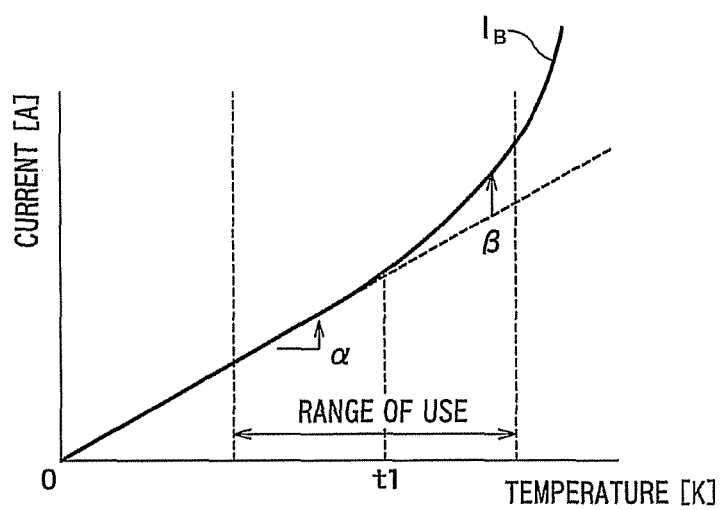
FIG. 10 is a graph illustrating a temperature characteristic of the bias current.

The temperature characteristic of the bias current $I_B$ depends on the first and second currents $I_1$ and $I_2$. This will be described with reference to FIG. 10. FIG. 10 is a graph illustrating the temperature characteristic of the bias current $I_B$ like FIG. 2.

The temperature characteristic of the first current $I_1$ is illustrated in FIG. 7. As illustrated in FIG. 7, the first current $I_1$ increases in proportion to the absolute temperature. On the other hand, the temperature characteristic of the second current $I_2$ is illustrated in FIG. 8. As illustrated in FIG. 8, the second current $I_2$ does not flow in the low-temperature region up to the predetermined temperature t1, and flows in the high-temperature region equal to or higher than the predetermined temperature t1.

Therefore, as illustrated by a letter α in FIG. 10, the magnitude of the first current $I_1$ determines a gradient of a proportional relation indicated by a dotted line. For this reason, the gradient of the proportional relation can be adjusted by adjusting the magnitude of the first current $I_1$ in the first embodiment. This corresponds to the adjustment of a rate of change of the bias current $I_B$ against temperature in the low-temperature region.

Further, as illustrated by a letter β in FIG. 10, the magnitude of the second current $I_2$ determines an amount of increase in bias current $I_B$ against the proportional relation indicated by the dotted line. For this reason, the amount of increase in bias current $I_B$ can be adjusted by adjusting the magnitude of the second current $I_2$ in the first embodiment. This corresponds to the adjustment of a compensation amount of the bias current $I_B$ in the high-temperature region.

On the other hand, as described above, the magnitudes (current values) of the first and second currents $I_1$ and $I_2$ can be adjusted by adjusting the resistance value of the external resistor $R_X$. Therefore, in this embodiment, the temperature characteristic of the bias current $I_B$ can be adjusted by adjusting the external resistor $R_X$. Consequently, according to this embodiment, the temperature compensation of the bias current $I_B$ can finely be adjusted.

In finely adjusting the temperature compensation, it is considered that the adjustment of the compensation amount β in the high-temperature region is required more frequently than the adjustment of the change rate α in the low-temperature region. Therefore, in the first embodiment, only the magnitude of the second current $I_2$ may be capable of being adjusted by the external resistor $R_x$, with respect to the magnitudes of first and second currents $I_1$ and $I_2$.

Further, in the bias circuit 101 of FIG. 4, the magnitude of the second current $I_2$ also determines a height of the predetermined temperature t1. Therefore, in the first embodiment, the height of the predetermined temperature t1 can be adjusted by adjusting the magnitude of the second current $I_2$, if the configuration of the bias circuit 101 is modified. For example, such a configuration can be realized by replacing the resistor R1 or R2 with an external resistor.

Further, in the first embodiment, the transistor Tr1 is controlled by the control voltage $V_{P1}$, and the transistor Tr3 is controlled by the control current $I_{P3}$. In other words, the transistors Tr1 and Tr3 are controlled by the different control signals. Therefore, in the first embodiment, the temperature compensation of the bias current $I_B$ can finely be adjusted without influencing the control of the transistor Tr1.

As described above, in this embodiment, the bias current $I_B$ has the current value that increases in proportion to the absolute temperature in the low-temperature region, and has the greater current value than the current value proportional to the absolute temperature in the high-temperature region. Further, in this embodiment, the magnitudes of the first and second currents $I_1$ and $I_2$ can be adjusted by adjusting the resistance value of the external resistor $R_X$. Consequently, according to this embodiment, the temperature compensation of the gain can be performed even in the high-temperature region, and the temperature compensation can finely be adjusted, in a circuit that processes a high-frequency signal.

In the first embodiment, each of the transistors Tr1 to Tr19 may be a bipolar transistor or an MOSFET. The base terminal of the bipolar transistor is an example of a control terminal of the present invention, and the emitter and collector terminals of the bipolar transistor are examples of main terminals of the present invention. The bipolar transistor may be a PNP transistor or an NPN transistor. Similarly, the gate terminal of the MOSFET is an example of the control terminal of the present invention, and the source and drain terminals of the MOSFET are examples of the main terminals of the present invention. The MOSFET may be a P-type transistor or an N-type transistor.

For example, the temperature compensation circuit of the first embodiment is used in a power amplifier for ETC (Electric Toll Collection system). Additionally, the temperature compensation circuit of the first embodiment can be applied to an analog circuit part for wireless communication, for a mobile telephone (such as WCDMA, GSM, PDC, NADC, and the like), DSRC, a digital TV, an analog TV, WiMAX, a wireless LAN, and specified low power wireless communication, for example.

In addition to the power amplifier and the wireless communication, the temperature compensation circuit of the first embodiment can be applied to various circuits (such as a mixer) as long as the gain increases by the current flowing.

The gain characteristic shown in FIG. 3 is often generated in a GHz (gigahertz) band circuit. Therefore, the temperature compensation circuit of the first embodiment is usefully applied to the GHz band circuit. However, the temperature compensation circuit of the first embodiment can also be applied to other circuits. For example, in addition to the GHz band circuit, the temperature compensation circuit of the first embodiment is also useful to a circuit in which the gain characteristic shown in FIG. 3 is generated.

In FIG. 4, the transistors Tr1, Tr2, Tr7, Tr8 and the like are the P-type MOSFETs. Alternatively, the transistors Tr1, Tr2, Tr7, Tr8, and the like may be PNP bipolar transistors. However, when the transistors Tr1 and the like are the P-type MOSFETs, advantageously the circuit area is reduced to be able to achieve the cost reduction of an integrated circuit, compared with a case where the transistors Tr1 and the like are the PNP bipolar transistors.

Further, sometimes a large current flows through a base of a PNP bipolar transistor. On the other hand, a current does not flow through a gate of a P-type MOSFET. This is also an advantage of the case where the transistors Tr1 and the like are the P-type MOSFETs.

In FIG. 4, the transistors Tr3, Tr4, Tr5, Tr6 and the like are the NPN bipolar transistors. Alternatively, the transistors Tr3, Tr4, Tr5, Tr6 and the like may be N-type MOSFETs. However, when the transistors Tr3 and the like are the NPN bipolar transistors, advantageously the circuit area is reduced while the characteristic is improved, compared with a case where the transistors Tr3 and the like are the N-type MOSFETs.

Hereinafter, second and third embodiments will be described. Since these embodiments are modifications of the first embodiment, differences between these embodiments and the first embodiment will mainly be described below.

(Second and Third Embodiments)

Figure 11:
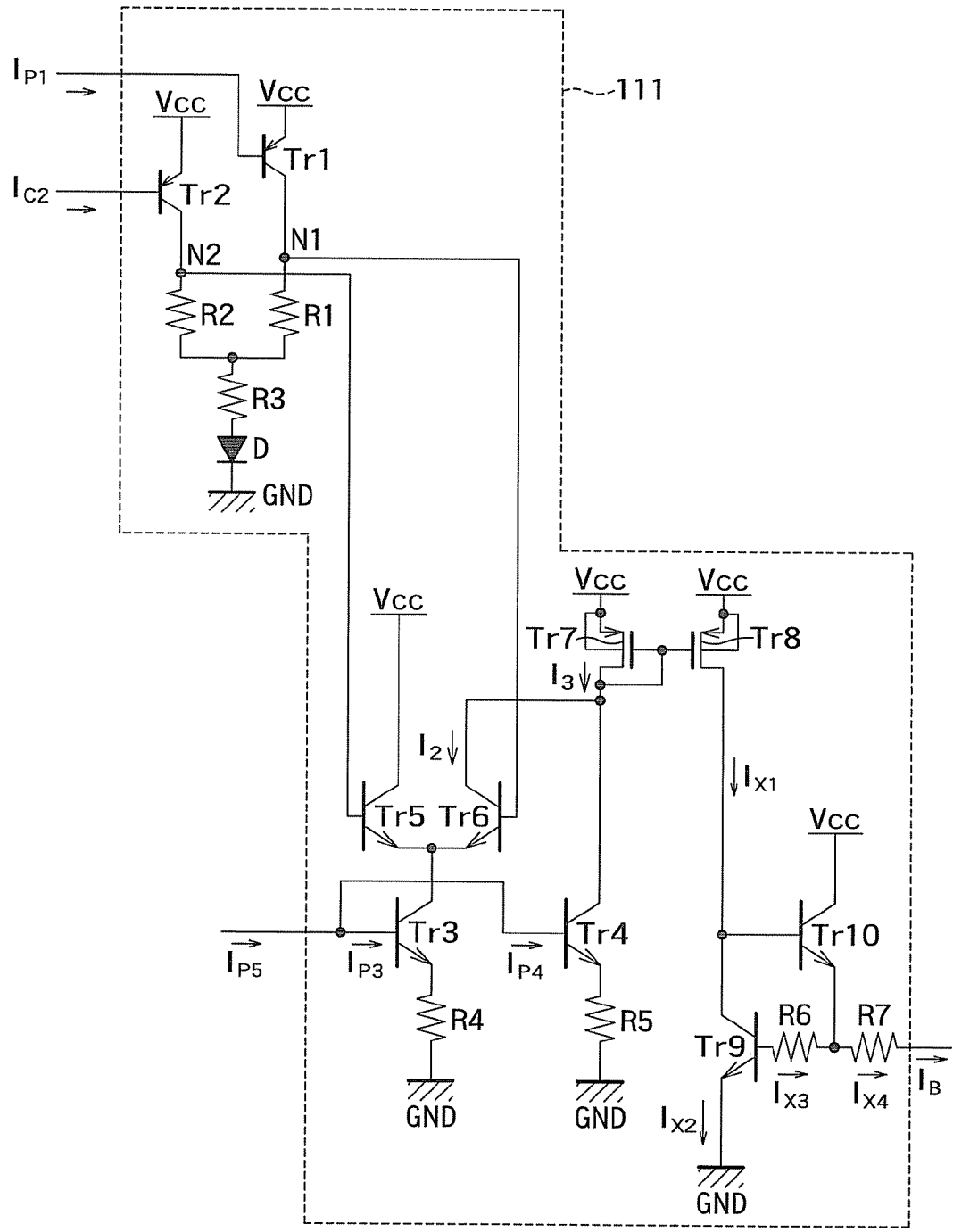
FIG. 11 is a circuit diagram illustrating a configuration of a bias current generating circuit according to a second embodiment.

FIG. 11 is a circuit diagram illustrating a configuration of a bias current generating circuit 111 of the second embodiment.

In FIG. 4, the transistors Tr1 and Tr2 are the P-type MOSFETs. On the other hand, in FIG. 11, the transistors Tr1 and Tr2 are PNP bipolar transistors. Therefore, in FIG. 11, the control voltage $V_{P1}$ is replaced by a control current $I_{P1}$ that increases in proportion to the absolute temperature, and the control voltage $V_{C2}$ is replaced by a control current $I_{C2}$ that is independent of the absolute temperature.

Figure 12:
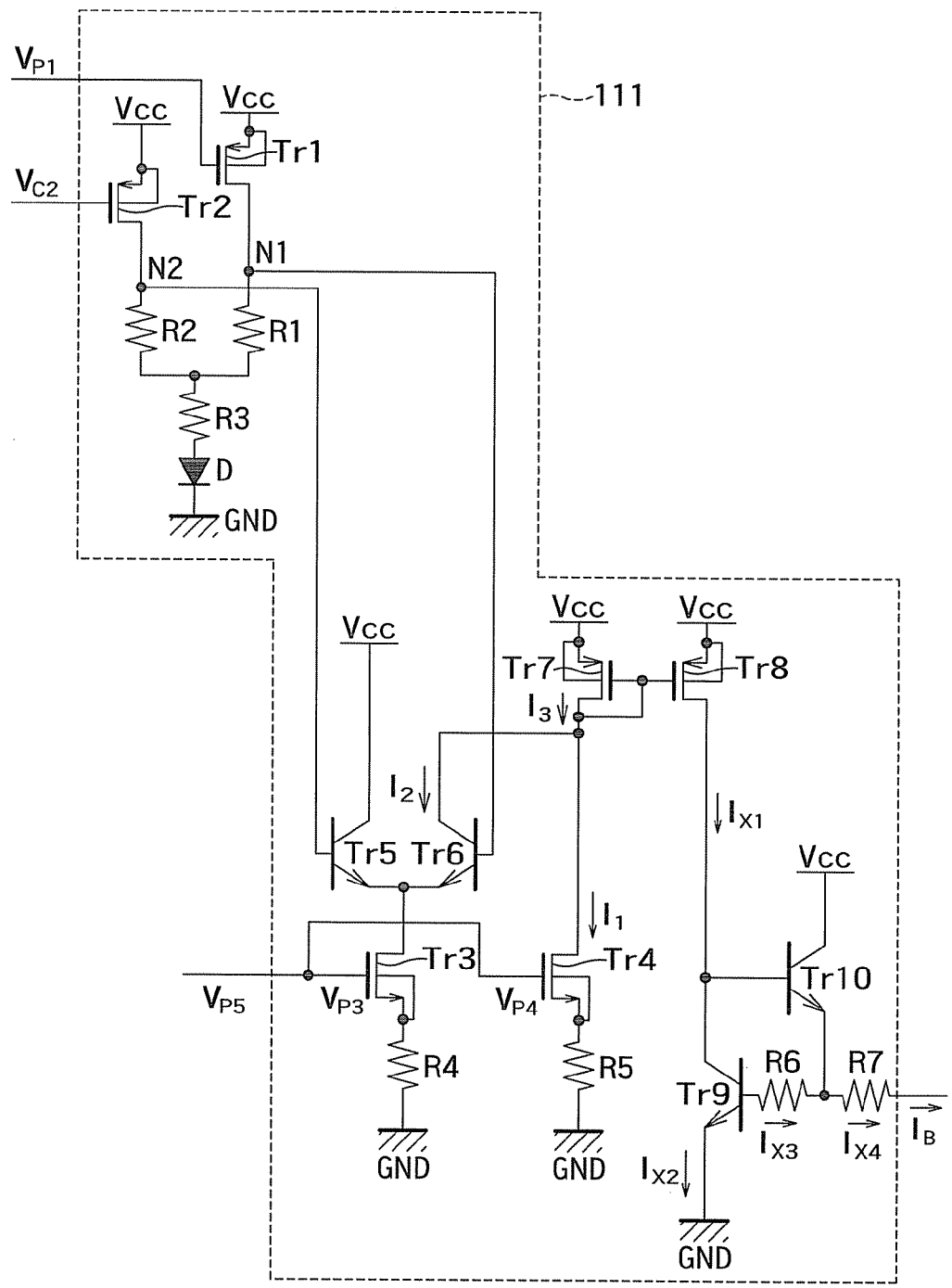
FIG. 12 is a circuit diagram illustrating a configuration of a bias current generating circuit according to a third embodiment.

FIG. 12 is a circuit diagram illustrating a configuration of a bias current generating circuit 111 of the third embodiment.

In FIG. 4, the transistors Tr3 and Tr4 are the NPN bipolar transistors. On the other hand, in FIG. 12, the transistors Tr3 and Tr4 are N-type MOSFETs. Therefore, in FIG. 12, the control currents $I_{P3}$, $I_{P4}$, and $I_{P5}$ are replaced by control voltages $V_{P3}$, $V_{P4}$, and $V_{P5}$ that increase linearly with respect to the absolute temperature. A relationship of $I_{P3}+I_{P4}=I_{P5}$ holds in the control currents $I_{P3}$, $I_{P4}$, and $I_{P5}$, and a relationship of $V_{P3}=V_{P4}=V_{P5}$ holds in the control voltages $V_{P3}$, $V_{P4}$, and $V_{P5}$.

In FIG. 12, because the transistors Tr3 and Tr4 are MOSFETs, the resistors R4 and R5 need not to be provided. When the transistors Tr3 and Tr4 are the MOSFETs, preferably the transistor Tr13 (see FIG. 4) is also an MOSFET. In this case, the resistor R9 (see FIG. 4) needs not to be provided.

According to the second and third embodiments, as with the first embodiment, the temperature compensation of the gain can be performed even in the high-temperature region, and the temperature compensation can finely be adjusted, in a circuit that processes a high-frequency signal.

As described above, according to the temperature compensation circuit of the embodiments of the present invention, the temperature compensation of the gain can be performed even in the high-temperature region, and the temperature compensation can finely be adjusted, in a circuit that processes a high-frequency signal.

Although examples of specific aspects of the present invention are described above with reference to the first to third embodiments, the present invention is not limited to these embodiments.

The invention claimed is:

1. A temperature compensation circuit comprising:
a first transistor having a control terminal supplied with a first signal;
a first resistor having a first end connected to an output of the first transistor;
a second transistor having a control terminal supplied with a second signal;
a second resistor having a first end connected to an output of the second transistor;
a third resistor having a first end connected to a first connection point to which a second end of the first resistor and a second end of the second resistor are commonly connected;
a constant voltage element connected to the third resistor;
a third transistor having a control terminal connected to the first end of the first resistor;
a fourth transistor having a control terminal connected to the first end of the second resistor;
a fifth transistor having a control terminal supplied with the first signal;
a first control circuit having a first input terminal connected to an output of the fifth transistor and supplied with a first current outputted from the fifth transistor, a second input terminal connected to a fourth resistor wherein a second current flows through the second input terminal, and an output terminal outputting a third current depending on a difference between a value of the first current and a value of the second current;
a sixth transistor having a control terminal supplied with the third current;
a seventh transistor having a control terminal which is connected to the control terminal of the sixth transistor, is supplied with the third current, and outputs a current depending on the third current to a second connection point to which the fourth and fifth transistors are commonly connected;
an eighth transistor having a control terminal connected to the control terminal of the sixth transistor;
a first mirror circuit connected to the eiqhth transistor; and
a second mirror circuit connected to the first mirror circuit.

2. The compensation circuit according to claim 1, wherein the first signal is a control signal changing linearly with respect to an absolute temperature; and
the second signal is a control signal independent of the absolute temperature.

3. The compensation circuit according to claim 2, wherein the first and second transistors are P-type MOS transistors.

4. The compensation circuit according to claim 3, wherein the third and fourth transistors and the seventh and eighth transistors are N-type MOS transistors.

5. The compensation circuit according to claim 3, wherein the third and fourth transistors and the seventh and eighth transistors are NPN bipolar transistors.

6. The compensation circuit according to claim 4, wherein the first to eighth transistors, the first to third resistors, the constant voltage element, the first control circuit, and the first and second mirror circuits are provided on one integrated circuit, and
the fourth resistor is provided outside the integrated circuit.

7. The compensation circuit according to claim 6, wherein the fourth resistor is a variable resistor.

8. The compensation circuit according to claim 5, wherein the first to eighth transistors, the first to third resistors, the constant voltage element, the first control circuit, and the first and second mirror circuits are provided on one integrated circuit, and
the fourth resistor is provided outside the integrated circuit.

9. The compensation circuit according to claim 8, wherein the fourth resistor is a variable resistor.

* * * * *